United States Patent [19]

Gliga

[11] Patent Number: 5,095,187

[45] Date of Patent: Mar. 10, 1992

[54] WEAKENING WIRE SUPPLIED THROUGH A WIRE BONDER

[75] Inventor: Alexandru S. Gliga, San Jose, Calif.

[73] Assignee: Raychem Corporation, Menlo Park, Calif.

[21] Appl. No.: 453,631

[22] Filed: Dec. 20, 1989

[51] Int. Cl.⁵ .......................... B23K 9/13; B23K 20/00
[52] U.S. Cl. ................................. 219/68; 219/56.21; 228/4.5
[58] Field of Search ................ 219/56.22, 56.21, 68; 228/4.5

[56] References Cited

U.S. PATENT DOCUMENTS

| | | | |
|---|---|---|---|
| 3,431,384 | 3/1969 | Cooper | 219/68 |
| 3,950,631 | 4/1976 | Schmidt et al. | 219/107 |
| 4,417,392 | 11/1983 | Ibrahim et al. | 29/840 |
| 4,705,204 | 11/1987 | Hirota et al. | 219/56.22 |

FOREIGN PATENT DOCUMENTS

| | | | |
|---|---|---|---|
| 53-123663 | 10/1978 | Japan | 219/56.22 |
| 57-64944 | 4/1982 | Japan | 219/56.22 |
| 1468974 | 3/1977 | United Kingdom | |

OTHER PUBLICATIONS

WO 88/04829, Carlomagno et al. (1988).
WO 88/09599, Cray et al. (1988).

Primary Examiner—Clifford C. Shaw
Attorney, Agent, or Firm—Yuan Chao; Herb Burkard

[57] ABSTRACT

A technique for weakening an interconnection wire provided on a contact on an electronic component, in which the wire is weakened by means of an arc which is created between the wire and an electrode provided in an aperture in the wall of the bonding head of the wire bonder through which the wire is supplied, the arc being generated by an electric field between the wire and the electrode. The electric field has a second portion in which its polarity is reversed, for controlling the dispersion of charged particles emitted from the wire. The electric field may be created by an arc generator which includes a capacitor which discharges through a transformer.

25 Claims, 5 Drawing Sheets

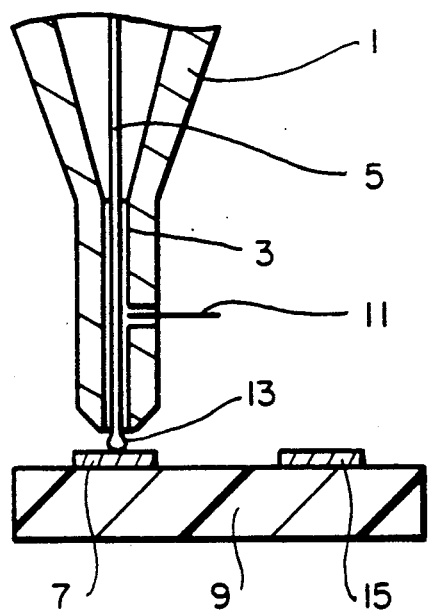
FIG_1
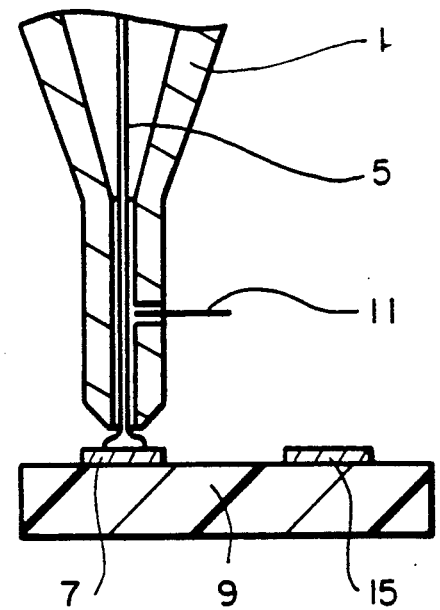
FIG_2
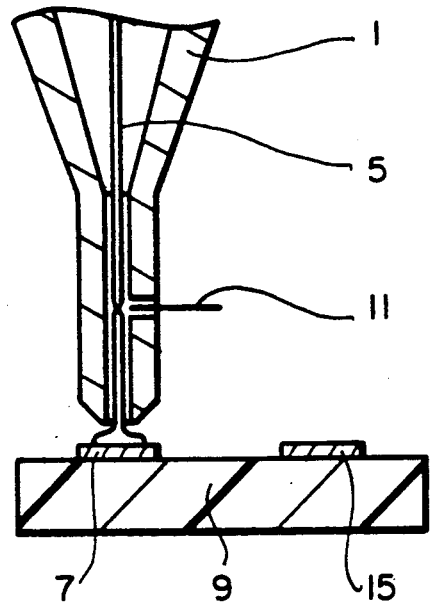
FIG_3
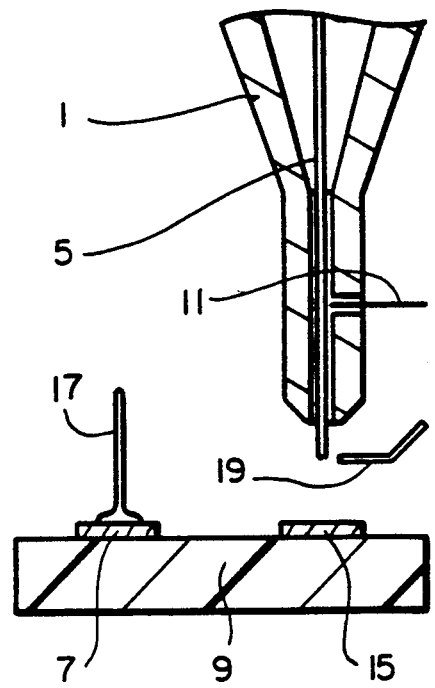
FIG_4

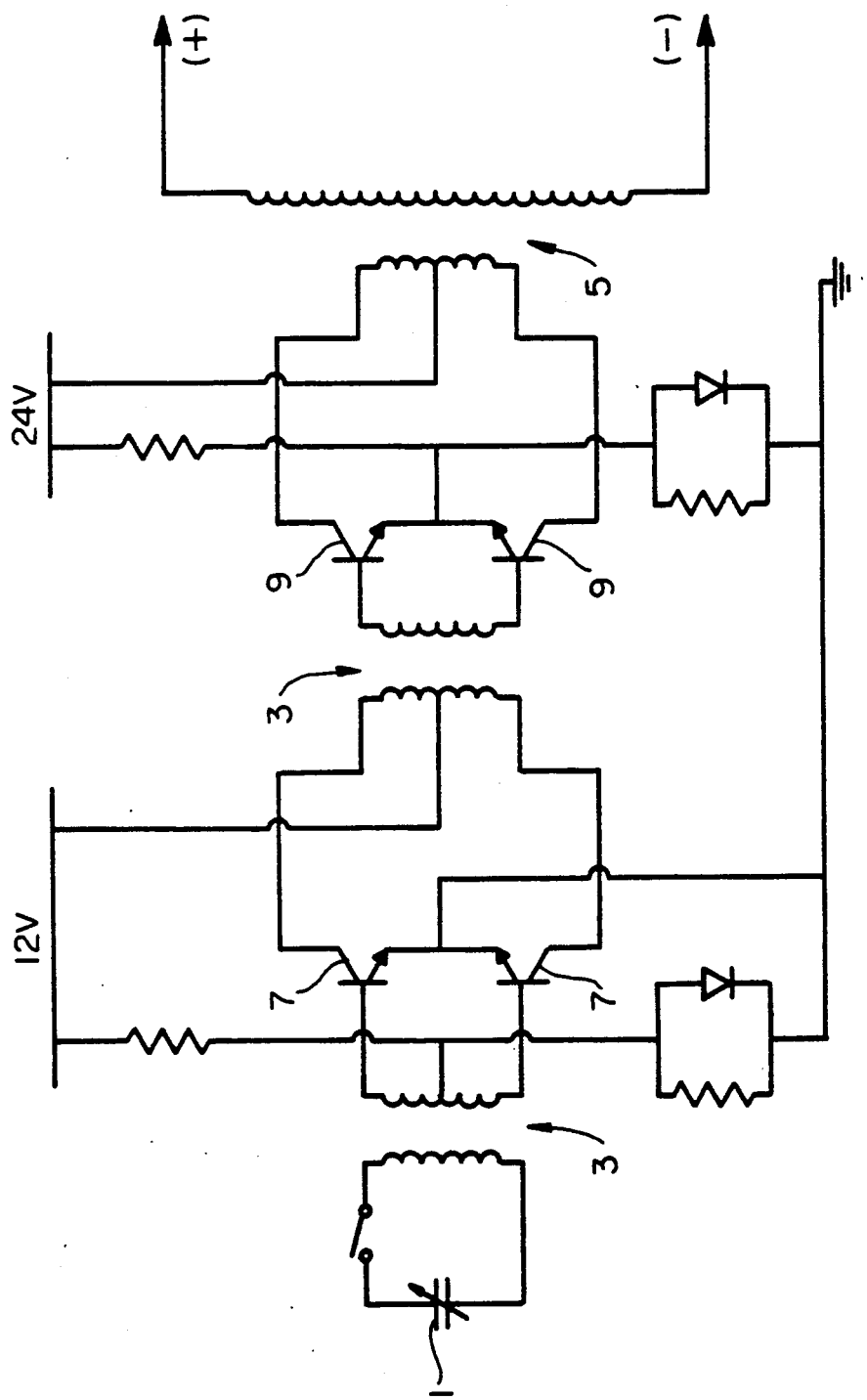
FIG_5

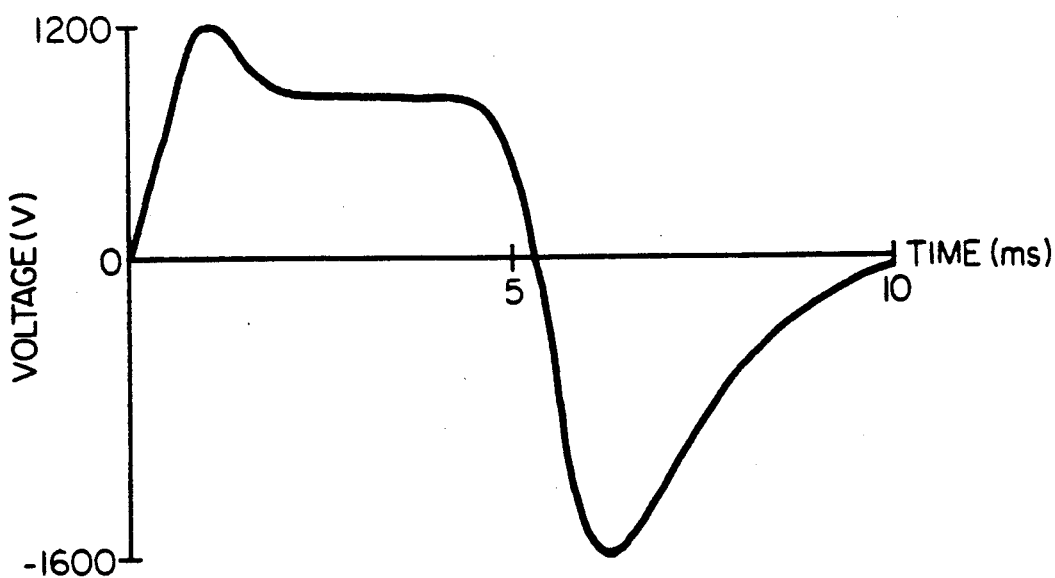
FIG_6
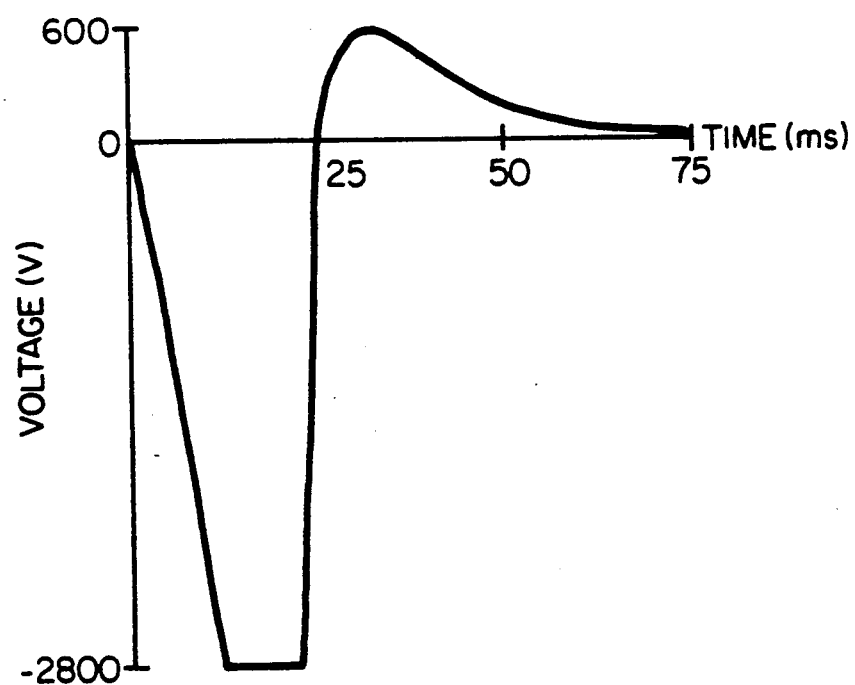
FIG_7

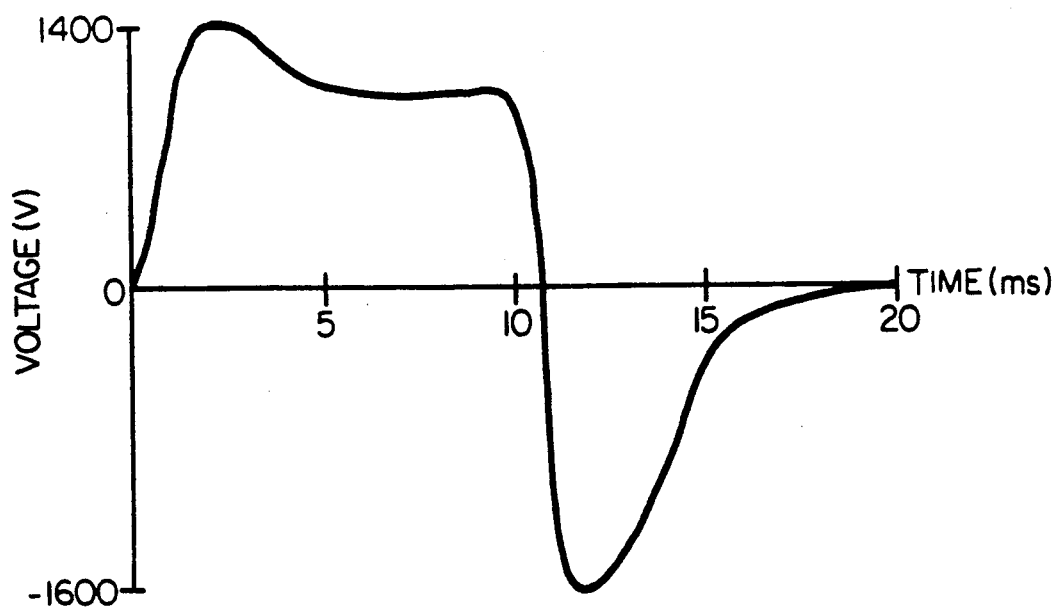
FIG_8
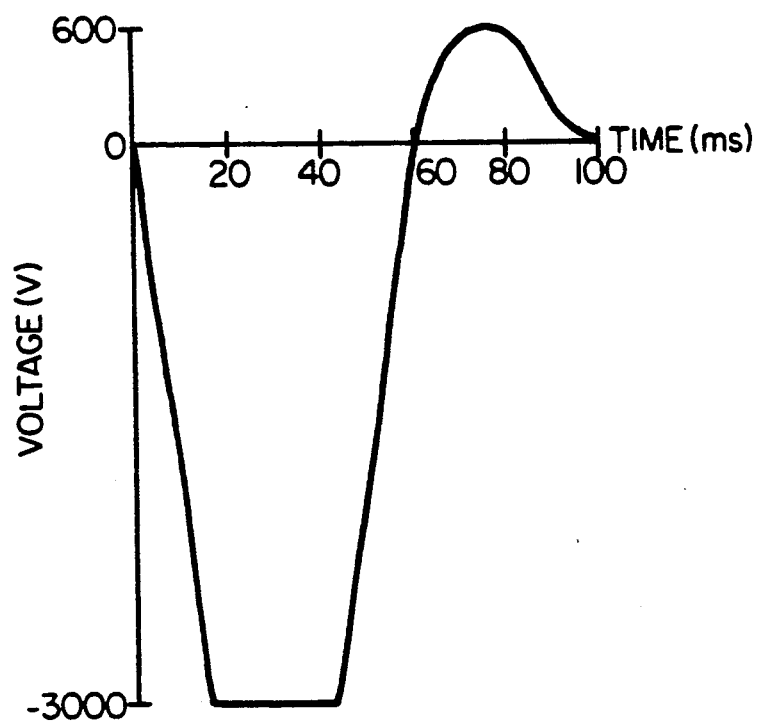
FIG_9

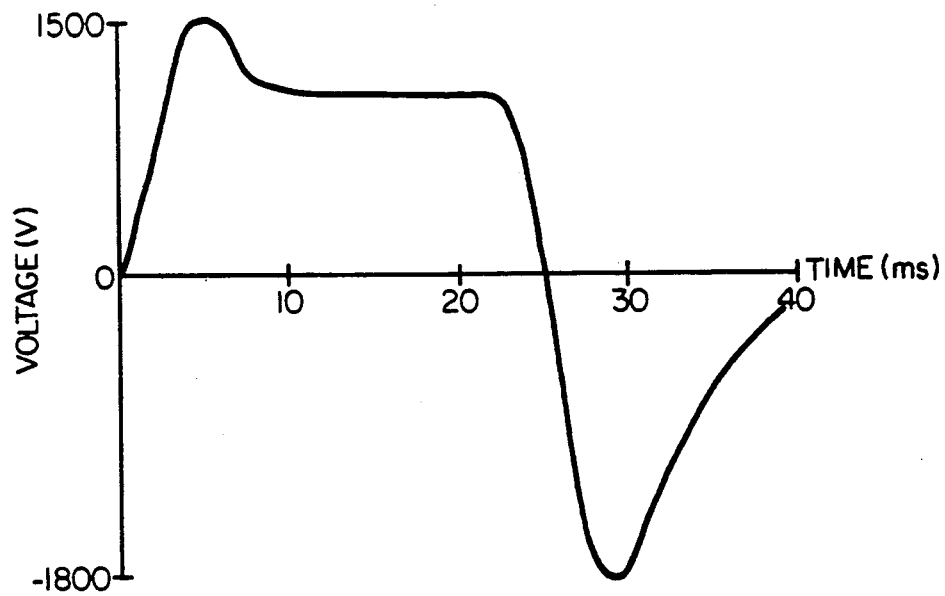
FIG_10
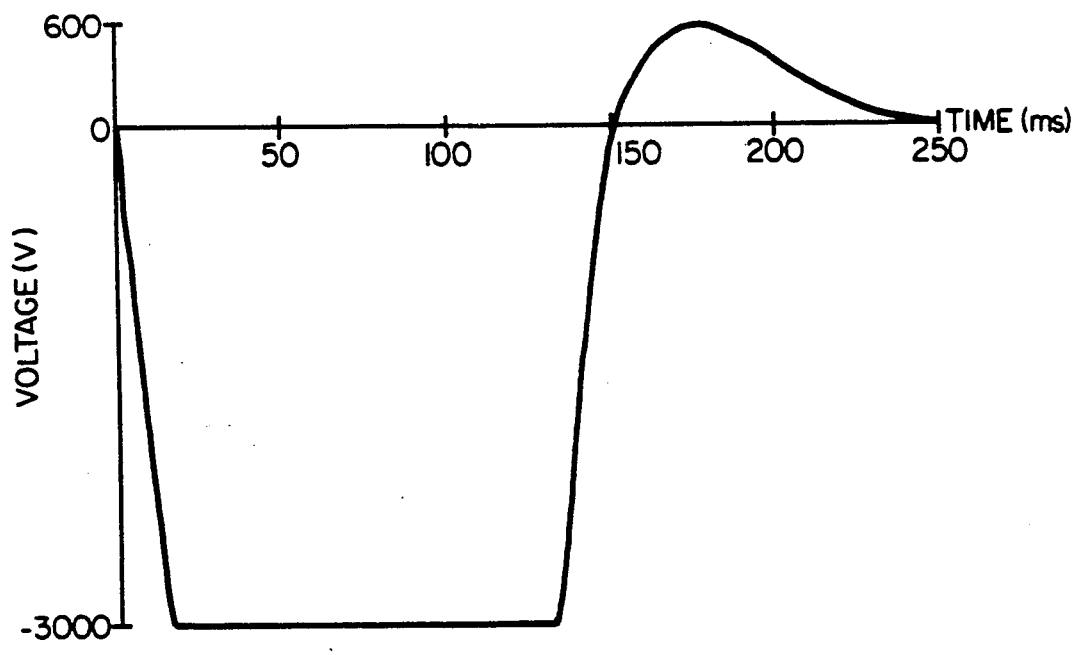
FIG_11

WEAKENING WIRE SUPPLIED THROUGH A WIRE BONDER

This invention relates to a bonding head for a wire bonder, and to a method of weakening an interconnection wire supplied through a bonding head on a wire bonder, which is suitable for forming a connection to a contact on an electronic component, such as, for example, integrated circuit (IC) chips, chip carriers, components which transmit or receive optical signals and printed circuit boards.

The subject matter disclosed in any document which is referred to below is incorporated in this specification by the reference to the document.

Connections to electronic components are commonly formed by means of metal wires (generally gold wires, especially hard drawn gold wires, although wires formed from other metals such as copper or aluminum may be used) which are bonded to contacts on the components without the use of materials other than those of the contact and the wire, for example by the application of one or a combination of heat, pressure and vibration, for example by thermocompression bonding which utilizes a combination of heat and pressure, or by thermosonic or ultrasonic bonding which utilize a combination of heat, pressure and vibration. The wires are connected at or towards their other ends to other contacts, often also by thermocompression bonding or a similar technique.

The component may be mounted on a substrate with its contacts facing upwards, in which case, the wires will generally extend from a contact on the component to respective contacts on the substrate, generally arranged around the perimeter of the component. The configuration of an interconnection made by this technique will be as disclosed in U.S. Pat. No. 4,417,392.

An alternative configuration of interconnection is disclosed in WO-A-88/0429 and WO-A-88/09599, in which components are mounted in face-to-face relationship, with interconnection wires extending between respective contacts on the facing surfaces of the components. The wires are connected at one end to contacts on one of the components by thermocompression bonding or by a similar technique, and are preferably connected at their other end to contacts on the other component by means of solder.

However connected to a second component, a wire connected at one end to an electronic component must generally be cut to a desired length. When the interconnection has the first of the configurations described above, the wire may be severed after it has been connected to the second component. When the interconnection has the second of the configurations described above, the wire will generally be severed after it has been connected to the contact on the first component, but before it has been connected to a contact on the second component. As disclosed in WO-A-88/0429 and WO-A-88/09599, an interconnection wire may be severed by weakening it at a point a desired distance from the bond to the contact, so that it breaks under a force applied to the wire in a direction away from the contact.

A wire may be weakened or severed by localized application to it of heat. A wire bonder which includes a heat source for weakening a wire is disclosed in WO-A-88/0429.

It is known to apply heat to a wire to melt the material of the wire, and to form a broadened portion on the end of the wire through which a bond to a substrate can be formed. Heat may be applied by means of an electrode from which an electric field can be made to extend to the wire such that an arc is created between the electrode and the wire. A wire bonder equipped with such an electrode is sold by Kulicke and Soffa, and uses an arc generator comprising a capacitor, the electrode being connected to one electrode of the capacitor. This arrangement has several disadvantages; in particular, it can be difficult to control important characteristics of the electric field such as the variation of voltage with time throughout each cycle, referred to in this specification as the wave shape of the field. Furthermore, because of the requirement that the amount of energy released from the capacitor when it is discharged be high, the power source used to charge it must be a high voltage source, and the time taken for the capacitor to charge is undesirably long, for example as long as 300 ms.

Particularly when wire is heated by means of an electric arc, charged particles of the material of the wire tend to be emitted from the wire. It is desirable that dispersion of the emitted particles be controlled in order that they do not lead to the formation of short circuits between contacts on the surface of one or more of the components. Furthermore, particularly when the electrode is positioned such the wire is weakened at a point within the bonding head, as disclosed in WO-A-88/0429, material of the wire that is emitted when it is heated tends to accumulate on the internal walls of the bonding head leading to, amongst other things, blocking of the passage within the bonding head and unreliable arc formation.

The present invention provides a technique for weakening an interconnection wire provided on a contact on an electronic component, which allows dispersion of charged particles emitted from the wire to be controlled.

In one aspect, the invention provides a bonding head for a wire bonder, having a tubular passage extending through it through which wire can be supplied for bonding to a contact on an electronic component, which includes:
  (a) an electrode from which an electric field can be generated to wire supplied through the bonding head; and
  (b) an arc generator which is electrically connected to the electrode, and which generates an electric field between the electrode and the wire having a wave shape which comprises (i) a first portion of a first polarity, which is such that an arc is created between the electrode and the wire which causes the wire to be weakened, and (ii) a second portion of reverse polarity for controlling dispersion of charged particles emitted from the wire.

The invention also provides a method of weakening an interconnection wire which is suitable for forming a connection to a contact on an electronic component, which comprises:
  (a) supplying wire through a bonding head on a wire bonder, the bonding head having a tubular passage extending through it, and being provided with an electrode from which an electric field can be generated to the wire; and
  (b) generating an electric field between the electrode and the wire having a wave shape which comprises
    (i) a first portion of a first polarity, which is such that an arc is created between the electrode and the wire which causes the wire to be weakened, and (ii) a second portion of reverse polarity for controlling dispersion of charged particles emitted from the wire.

The bond between the wire and the contact may be formed between the circumferential surface of the wire and the contact, the wire being bent adjacent to the bonded portion so that it extends away from the contact. This is generally known as wedge bonding.

More preferably however, the bond is formed between the end of the wire and the contact. This technique generally involves heating the wire at or near its end to form a ball. The bond is then formed between the ball and the contact. This technique is generally known as ball bonding.

The nature of the bonding head will be determined by the nature of the bond to be made thereby. When the bonding head is for making a ball bond, it will generally be a "capillary". When the bonding head is for making a wedge bond, it will generally be a "wedge", these terms having recognised meanings in the art.

The electrode may be provided externally of the bonding head, for example on an external surface. For example, it may be provided by a stripe of a conducting material such as a conducting paint. An advantage of the electrode being positioned externally of the bonding head is that it is relatively convenient to manufacture the bonding head. It is also possible to form relatively short interconnection wires conveniently using such a bonding head. The use of an field having a wave shape comprising two portions, with a bonding head having an external electrode, has the advantage that material of the wire that is emitted as a result of heating by the generated arc tends to accumulate on the electrode rather than on the surface of the component to which the wire is bonded. This reduces the likelihood of such emitted material forming short circuits between contacts on the surface of the component. Particularly when the electrode is mounted externally of the bonding head, it is preferred that the method of forming the interconnection wire includes the step of moving the bonding head away fom the contact before weakening the wire. The length of the interconnection wires may be selected by controlling the distance through the bonding head is moved, for example by use of a stepping motor.

It is particularly preferred that the electrode be arranged so that the wire is weakened at a point within the bonding head, generally by having the field extend from the electrode at a point within the bonding head; for example, in a preferred arrangement, the electrode may be located in an aperture in the wall of the bonding head which communicates with the tubular passage through which the wire is supplied. Weakening of the wire within the bonding head has significant advantages. For example, it enables the wires to be cut reproducibly to a desired length by resting the bonding head on the contact to which the wire is connected of on a broadened portion of the wire in the vicinity of the contact. Cutting the wire with the bonding head in this position ensures that the wire has a predetermined length measured from the contact or from a point immediately above the broadened portion of the wire. This can be important when it is necessary to cut wires accurately to a desired length, as is the case for interconnections having the configuration disclosed in WO-A-88/0429. The use of an electric field having a wave shape comprising two portions, with a bonding head having an internal electrode, has the advantage that material of the wire that is emitted as a result of heating by the generated arc tends to accumulate on the electrode rather than on the surface of the component to which the wire is bonded or, more particularly, on the internal surface of the bonding head. Accumulation of material of the wire on the internal surface of the bonding head has the significant disadvantage that the arc intended to cut wire supplied through the bonding head may extend between the electrode and emitted wire material that has accumulated on the internal surface of the bonding head, rather than between the electrode and the wire itself. This can reduce significantly the accuracy with which the wire can be severed to a desired length, and in extreme cases, it can lead to failure of the arc to weaken the wire. Furthermore, it can lead to blocking of the tubular passage within the bonding head.

The accumulation of material emitted from the wire on the electrode used to weaken the wire has the added advantage that emitted material can be removed from the bonding head simply by removing the electrode and replacing it with a clean one; as a result, the frequency with which it is necessary to clean internally or to replace the bonding head because of accumulated wire material is significantly reduced.

Particularly when the electrode used to weaken the wire is arranged so that the wire is weakened at a point within the bonding head, it is preferred that the bonding head also include a second electrode from which an electric field can be generated to the wire at a point outside the tubular passage. The method of the invention may include the steps of extending the end of the wire beyond the end of the tubular passage after it has been severed, and forming a broadened portion on the end of the wire, and the broadened portion may be formed by creating an arc between the wire and the second electrode. It is particularly preferred that the wave shape of the field between the second electrode and the wire is such that the electrode is at a positive potential relative to the wire.

The electrode may be provided by a wire of a material which is selected for its ability to withstand the high temperatures to which it is exposed while the arc exists, tungsten being an example of a suitable material. When the electrode provided by a wire is positioned for weakening the wire at a point within the bonding head, it may located in an aperture in the wall of the bonding head. Electrodes may also be provided by coatings of conducting material on a surface of the bonding head, for example by a stripe of a conducting paint (particularly when the electrode is provided externally of the bonding head), or by plated material which may be provided on an external surface or on an internal surface of the bonding head, for example a surface of an aperture in the wall of the bonding head.

The electrode which is used in weakening of the wire may generate an arc at more than one point around the wire. For example, it may generate the arc at two diametrically opposed points on opposite sides of the wire provided by two wires which are electrically interconnected, or it may have the form of a ring through which the wire passes. Preferably, the arrangement of the electrode around the wire is approximately symmetrical. The use of an electrode which can generate an arc at more than one point around the wire has the advantage that the wire is weakened more uniformly and can reduce variation in the effect of the arc on the wire as a result of the wire being able to move laterally within the tubular passage.

When the electrode is arranged so that the wire is weakened at a point within the bonding head, it preferred that the internal diameter of the tubular passage within the bonding head is constant over a distance on each side of the point at which the wire is weakened, more preferably of at least about X, especially at least about 2.5X, more especially of at least about 4X, where X is the internal diameter of the passage at the point where the aperture and the passage meet. This feature has been found to contribute to the accuracy with which the wire can be cut since the wire is less able to move laterally within the tubular passage than in a conventional bonding head in which the tubular passage is flared outwardly from a point a short distance above the opening from which the wire leaves the passage.

Preferably, the arc generator comprises a capacitor which is arranged to be discharged through a transformer. This arrangement can be used to provide an electric field having a wave shape which comprises two portions having different polarities. It has the advantage that details of the wave shape such as the peak voltage and the duration of each portion can be changed simply by varying the inductance of the transformer or the capacitance of the capacitor or both in a known fashion; such variations can also be used to change the energy that is released when the arc is created. This adaptability allows a single arc generator to be used to generate arcs having characteristics suitable for weakening different wires, for example, wires of different sizes or materials or both, in a reliable and reproducible manner.

Furthermore, the transformer can be used to ramp up the peak voltage of the signal emitted by the capacitor, allowing a capacitor to be used which has a relatively low capacitance. As a result, a relatively low voltage power source can be used to charge the capacitor, and the time taken to charge the capacitor after it has been discharged can be as little as 30 μs.

In another aspect, the invention provides a bonding head for a wire bonder, having a tubular passage extending through it through which wire can be supplied for bonding to a contact on an electronic component, which includes:

(a) an electrode from which an electric field can be generated to wire supplied through the bonding head; and (b) an arc generator which is electrically connected to the electrode, comprising a capacitor which is connected to one coil of a transformer, the electrode being connected to the other coil of the transformer.

Preferably, the arc generator generates an electric field having a wave shape in which, in the first portion of the wave, the electrode is at a positive potential relative to the wire. This has the advantage that the voltage required to generate an arc between the wire and the electrode is less than that required when the electrode is initially at a negative potential relative to the wire. As a result, the energy which is expended to weaken the wire can be less, and the wire is melted to a very much lesser extent, allowing the weakening of the wire to be controlled, and allowing the wire to be cut in a particularly clean manner. The subsequent reversal of polarity ensures that any positively charged particles emitted from the wire as a result of exposure to the arc are drawn towards the electrode and do not accumulate on a surface of the bonding head. Material of the wire which accumulates on the electrode will disperse when a subsequent arc is generated. Other accumulated material of the wire can be removed by replacement of the electrode.

The arc generator may generate an electric field having a wave shape in which, in the first portion of the wave, the electrode is at a negative potential relative to the wire. This has the advantage that the wire can be severed in a particularly clean manner, without leading to the free ends of the severed wire being broadened as can often happen if the opposite polarity arrangement is used. The subsequent reversal of polarity can ensure that dispersion of positively charged particles emitted from the surface of the wire as result of the electric field is controlled in such a way that the particles accumulate on the surface of the wire.

The potential difference between the electrode and the wire in the first portion of the wave is selected such that it results in an arc being generated between the electrode and the wire, which causes the wire to be weakened as a result of localized heating of the wire. It is preferred that the peak potential difference between the electrode and the wire in the first portion of the wave is at least about 1000 volts, more preferably at least about 1500 volts, for example about 2000 volts, higher voltages being preferred when the electric field generated by the arc generator has a wave shape in which, in the first portion of the wave, the electrode is at a negative potential relative to the wire.

The potential difference between the electrode and the wire in the second portion of the wave will generally be less than that in the first portion of the wave, since it will not generally be necessary that it results in an arc being created between the electrode and the wire; indeed it will often be desired that an arc is not generated. The potential difference will preferably be less than about half that in the first portion of the wave. Preferably, the peak potential difference between the electrode and the wire in the second portion of the wave is less than about 600 volts, for example about 475 volts.

The duration of the first portion of the wave will generally be as short as possible in order to minimize emission of charged particles from the wire as a result of heating by the arc, consistent with the requirement that the wire is weakened to a sufficient extent, for example so that it breaks under an applied force. It has been found that the emission of charged particles from a gold wire begins after exposure to an electric field of about 2000 volts for about 15 μs. However, for significant weakening of the wire, it is necessary for it to be exposed to the field for at least about 1 ms. Dispersion of charged particles emitted during the latter stages of such prolonged exposure to the electric field is controlled by the subsequent reversal of the polarity of the field.

The duration of the second portion of the wave will be as short as possible in order to minimize the cycle time for the arc generator, consistent with the requirement that sufficient charged particles emitted from the wire are captured. Generally, the duration of the second portion of the wave will be greater than that of the first portion, preferably at least about four times that of the first portion.

The step in the method of weakening the wire may involve severing the wire directly. Alternatively, the wire may by severed by being weakened at a point a desired distance from the bond to the contact in such a way that it breaks under an applied force at the point at which it has been weakened. Preferably, the method involves weakening the wire first, so that it breaks when a force is applied subsequently. Alternatively, the force may be applied to the wire which is then weakened while the force is being applied. The force which is applied to the wire is sufficient to break the wire at the point at which it has been weakened but should not be so great that the bond between the wire and the contact is broken. The combination of applying force to the wire, and then weakening it to cause it to break at a predetermined point, has the advantage that it is a particularly convenient way to break wires to a repeatable length.

Preferably, the method includes the step of bonding the wire the a contact on an electronic component. More preferably, the wire is bonded to the contact without the use of a material other than the materials of the contact and the wire.

Preferably, the method includes the step of applying force to the wire in a direction away from the contact, the force causing the wire to sever at the point at which it has been weakened.

The wire which is used to form interconnection wires in accordance with the present invention will be as fine as possible consistent with the mechanical and electrical requirements placed upon it when in use, and on the requirements for handling it and for bonding it to the contacts. Generally, the wire will be substantially round and will have a diameter of less than about 375 $\mu$m, preferably less than about 250 $\mu$m. Particular preferred wire has a diameter of from about 12 $\mu$m to about 125 $\mu$m, especially from about 25 $\mu$m to about 75 $\mu$m.

The contact on the surface of the component, to which the interconnection wire is or is to be connected, may be in the form of, for example, a pad, or an end of a conductive trace which runs parallel on perpendicular (or at an angle between the two) to the surface, such as a via. It may be recessed, coplanar with the surrounding surface of the component, or it may stand proud of the surface.

Embodiments of the present invention will now be described by way of example with reference to the accompanying drawings, in which:

FIGS. 1 to 4 are schematic representations of the bonding head of a wire bonder and an electronic component, showing sequential steps in a method by which interconnection wires are provided on contacts on the electronic component;

FIG. 5 is a schematic diagram of a circuit which may be used in an arc generator; and FIGS. 6 to 11 show diagrams of circuits which are used in the arc generator.

Referring to the drawings, FIG. 1 shows a bonding head 1 of a wire bonder, having a tubular passage 3 extending through it through which gold wire 5 is supplied for bonding to a contact 7 on an electronic component 9. An electrode 11 in the form of a tungsten wire is provided in an aperture in the wall of the bonding head, for generating an electric field between it and the wire. On each side of the aperture in which the electrode 11 is located, the internal diameter of the tubular passage is arranged to be constant over a distance which is greater than 2.5$\times$, where x is the internal diameter of the passage at the point where the aperture and the passage meet.

The wire 5 has a broadened portion 13 on the end which extends from the bonding head 1, which is rested on the contact 7. A bond is formed between the broadened portion 13 of the wire and the contact 7 without the use of a material other than the materials of the contact and the wire, by the application of heat and pressure to the contact 7 through the broadened portion 13 of the wire and the bonding head 1, that is to say, by thermocompression bonding. FIG. 2 shows the component 9 with the wire 5 bonded to the contact 7.

The wire 5 is severed by weakening it at a point a desired distance from the bond to the contact 7, and then applying force in a direction away from the contact. The wire is weakened by generating an electric field between it and the electrode 11 having a wave shape which comprises a first portion in which the electrode is at a negative potential relative to the wire, and which is such that an arc is created between the electrode and the wire which causes the wire to be weakened. The wave shape comprises a second portion in which the electrode is at a positive potential relative to the wire, for controlling dispersion of charged particles from the wire. Characteristics of the arc generator used to generate electric fields having suitable wave shapes are discussed below. FIG. 3 shows the component 9 with the wire 5 bonded to the contact 7, the wire having been weakened at a point a desired distance from the bond to the contact.

Force is applied to the wire 5 to sever it by clamping it within the bonding head 1 and then moving the bonding head away from the contact 7. The resulting interconnection wire 17 is shown in FIG. 4. After forming an interconnection wire, the bonding head 1 may be positioned above another contact 15 on the component 9, on which another interconnection wire is to be formed. Before the steps above can be repeated, it is necessary to form a broadened portion on the end of the wire 5 which resulted from breaking the wire after forming the previous interconnection wire 17. For this purpose, the bonding head 1 includes a second electrode 19 from which an electric field can be generated to the wire 5 at a point outside the tubular passage 3. The broadened portion is formed by first extending the end of the wire 5 beyond the end of the tubular passage 3, and generating an electric field between the second electrode 19 and the exposed end of the wire such that an arc is formed between them. The wave shape of the field is such that the electrode is at a positive potential relative to the wire.

FIG. 5 is a schematic diagram of a circuit which may be used in an arc generator, for generating an arc between a bonding head of the wire bonder and a wire which extends through the bonding head. The characteristics of components of the circuit, such as of the resistors, capacitors, transistors and transformers, are selected to give rise to arcs having a desired wave shape. The circuit includes a capacitor 1 which is discharged through two R.F. transformers 3 and a high voltage transformer 5. The circuit also includes two low power (about 2 watts) R.F. transistors 7 and two high power (about 30 watts) R.F. transistors 9.

FIG. 6 shows the wave shape of an arc which can be used to weaken a gold wire having a diameter of about 25 $\mu$m. In the first portion of the wave, the electrode is at a positive potential relative to the wire.

FIG. 7 shows the wave shape of an arc which can be used to weaken a gold wire having a diameter of about 25 $\mu$m. In the first portion of the wave, the electrode is at a negative potential relative to the wire.

FIG. 8 shows the wave shape of an arc which can be used to weaken a gold wire having a diameter of about 45 μm. In the first portion of the wave, the electrode is at a positive potential relative to the wire.

FIG. 9 shows the wave shape of an arc which can be used to weaken a gold wire having a diameter of about 45 μm. In the first portion of the wave, the electrode is at a negative potential relative to the wire.

FIG. 10 shows the wave shape of an arc which can be used to weaken a gold wire having a diameter of about 75 μs. In the first portion of the wave, the electrode is at a positive potential relative to the wire.

FIG. 11 shows the wave shape of an arc which can be used to weaken a gold wire having a diameter of about 75 μs. In the first portion of the wave, the electrode is at a negative potential relative to the wire.

What is claimed is:

1. A bonding head for a wire bonder, having a tubular passage extending through it through which wire can be supplied for bonding to a contact on an electronic component, which includes:
   (a) an electrode from which an electric field can be generated to wire supplied through the bonding head; and
   (b) an arc generator which is electrically connected to the electrode, and which generates an electric field between the electrode and the wire having a wave shape which comprises (i) a first portion of a first polarity, wherein the potential difference between the electrode and the wire is such that an arc is created between the electrode and the wire which causes the wire to be weakened, and (ii) a second portion of reverse polarity for controlling dispersion of charged particles emitted from the wire, wherein the potential difference between the electrode and the wire is less than the potential difference in the first portion and insufficient to generate an arc between the electrode and the wire; the electrode being so arranged so that the wire is weakened at a point within the bonding head by having the electric field extending from the electrode at a point within the bonding head.

2. A bonding head as claimed in claim 1, in which the arc generator includes a capacitor which is discharged through a transformer.

3. A bonding head as claimed in claim 1, in which, in the first portion of the wave, the electrode is at a positive potential relative to the wire.

4. A bonding head as claimed in claim 1, in which the peak potential difference between the electrode and the wire in the second portion of the wave is less than that in the first portion thereof.

5. A bonding head as claimed in claim 4, in which the peak potential difference between the electrode and the wire in the second portion of the wave is less than about half that in the first portion thereof.

6. A bonding head as claimed in claim 1, in which the peak potential difference between the electrode and the wire in the first portion of the wave is at least about 1000 volts.

7. A bonding head as claimed in claim 1, in which the peak potential difference between the electrode and the wire in the second portion of the wave is less than about 600 volts.

8. A bonding head as claimed in claim 1, in which the duration of the second portion of the wave is greater than that of the first portion thereof.

9. A bonding head as claimed in claim 8, in which the duration of the second portion of the wave is at least about four times that of the first portion thereof.

10. A bonding head as claimed in claim 1, which includes a second electrode from which an electric field can be generated to the wire at a point outside the tubular passage.

11. A bonding head as claimed in claim 10, in which the wave shape of the field between the second electrode and the wire is such that the electrode is at a positive potential relative to the wire.

12. A bonding head according to claim 1, wherein the electrode is located in an aperture in the wall of the bonding head which communicates with the tubular passage through which the wire is supplied.

13. A method of weakening an interconnection wire which is suitable for forming a connection to a contact on an electronic component, which comprises:
   (a) supplying wire through a bonding head on a wire bonder, the bonding head having a tubular passage extending through it, and being provided with an electrode from which an electric arc can be generated extending from the electrode at a point within the bonding head to the wire to weaken the wire at a point within the bonding head; and
   (b) generating an electric field between the electrode and the wire having a wave shape which comprises (i) a first portion of a first polarity, wherein the potential difference between the electrode and the wire is such that an arc is created between the electrode and the wire which causes the wire to be weakened, and (ii) a second portion of reverse polarity for controlling dispersion of charged particles emitted from the wire, wherein the potential difference between the electrode and the wire is less than the potential difference in the first portion and insufficient to generate an arc between the electrode and the wire.

14. A method as claimed in claim 13, in which, in the first portion of the wave, the electrode is at a positive potential relative to the wire.

15. A method as claimed in claim 13, in which the peak potential difference between the electrode and the wire in the second portion of the wave is less than that in the first portion thereof.

16. A method as claimed in claim 15, in which the peak potential difference between the electrode and the wire in the second portion of the wave is less than about half that in the first portion thereof.

17. A method as claimed in claim 13, in which the duration of the second portion of the wave is greater than that of the first portion thereof.

18. A method as claimed in claim 17, in which the duration of the second portion of the wave is at least about four times that of the first portion thereof.

19. A method as claimed in claim 13, which includes the steps of extending the end of the wire beyond the end of the tubular passage after the wire has been severed, and forming a broadened portion on the end of the wire.

20. A method as claimed in claim 19, in which the bonding head includes a second electrode from which an electric field can be generated to the wire at a point outside the tubular passage, and which includes the step of forming the broadened portion on the end of the wire by creating an arc between the wire and the second electrode.

21. A method as claimed in claim 13, which includes the step of bonding the wire to a contact on an electronic component.

22. A method as claimed in claim 21, in which the wire is bonded to the contact without the use of a material other than the materials of the contact and the wire.

23. A method as claimed in claim 21, which includes the step of applying force to the wire in a direction away from the contact.

24. A method as claimed in claim 23, in which the wire is severed, at the point at which it is weakened by the arc, as a result of the application of force to the wire.

25. A method according to claim 13, wherein in the bonding head the electrode is located in an aperture in the wall of the bonding head which communicates with the tubular passage through which the wire is supplied.

* * * * *